United States Patent [19]
Singh et al.

[11] Patent Number: 5,837,054
[45] Date of Patent: Nov. 17, 1998

[54] CRYSTALS FOR ULTRAVIOLET LIGHT FILTERS

[75] Inventors: Narsingh B. Singh; William D. Partlow, both of Export, Pa.; Steven Strauch, Ellicott City, Md.; Albert M. Stewart, Pittsburgh; John F. Jackovitz, Monroeville, both of Pa.; David W. Coffey, Columbia, Md.; Robert Mazelski, Monroeville, Pa.

[73] Assignee: Northrop Grumman Corporation, Los Angeles, Calif.

[21] Appl. No.: 709,399

[22] Filed: Aug. 30, 1996

[51] Int. Cl.$^6$ .............................. C30B 7/00; C30B 29/12
[52] U.S. Cl. .............................. 117/10; 117/74; 117/940; 117/68
[58] Field of Search .................. 117/10, 13, 74, 117/940, 68

[56] References Cited

PUBLICATIONS

"Crystal Structure of the Fluosilicate Hexahydrate of Cobalt, Nickel and Zinc." from Acta Crystallogr. Sect. B (1973), 29 (Pt. 12) pp. 2741–2747 by Ray Siddhartha, 1973.

"Low temperature Optical Absorption of Nickel Fluosilicate Crystals" by M. H. L. Pryce, G. Agnetta, T. Carofano, M. B. Palma–Vittorelli and M. U. Palma, Phil. Mag., 10, 477–496 (1964).

*Primary Examiner*—Robert Kunemund
*Assistant Examiner*—Evelyn A. Defilló
*Attorney, Agent, or Firm*—Walter G. Sutcliff

[57] ABSTRACT

Crystals formed of a solid-solution of $NiSiF_6 6H_2O$ provide very good materials for filtering ultraviolet light and will not deteriorate in temperatures as high as 115° C. They are particularly useful in sensing devices which seek to identify the presence of ultraviolet light in the UV missile warning band.

14 Claims, 2 Drawing Sheets

CRYSTALS FOR ULTRAVIOLET LIGHT FILTERS

FIELD OF INVENTION

The invention relates to crystals having thermal and optical properties suitable for use in ultraviolet light filters and sensors.

BACKGROUND OF THE INVENTION

There are a variety of devices which use ultraviolet (UV) light filters that allow selected wavelengths of light to pass therethrough. Such filters are used in missile approach warning systems which locate and track: sources of ultraviolet energy, enabling the system to distinguish the plume of an incoming missile from other UV sources that pose no threat. The benefit of this system is the ability to estimate missile range and closing velocity to time the ejection of flare-decoys to maximize their effectiveness against infrared-guided missiles. This system can be also used to aim a beam of infrared energy at an IR guided missile to confuse its guidance system.

The success and efficiency of the system for helicopters or transport-type aircrafts depends on the UV sensors. Commercially available nickel sulfate hexahydrate. crystals are widely used for these sensors. The biggest: problem for these sensors arises due to low thermal stability of nickel sulfate crystals. The crystals start deteriorating as the temperature starts rising above 60° C. This rise can be due to atmosphere as well as heat generated by working systems in the aircraft. Aircraft parked in tropical and desert areas can experience very high temperatures. In such heat the stability of these systems is very questionable. There is an urgent need for an ultraviolet filter material with higher temperature stability, good crystal growth suitability, and desired filter transmittance and bandwidths.

The filter should have high transmittance at the desired wavelength. For missile warning systems, the crystal should be transmissive in the ultraviolet spectral region and have strong absorption at longer wavelengths. Furthermore, the crystal should be able to survive prolonged exposures to temperatures above 85° C. and preferably not be adversely affected by temperatures in the range 100° C. to 115° C.

In 1964, H. L. Pryce et al. published their article "Low-Temperature Optical Absorption of Nickel, Flouosilicate Crystals", Phil. Mag. 10, 477 (1964). The article presents data for the light spectrum which will be transmitted through a $NiSiF_6 6H_2O$ crystal, but contains no information about temperature stability. That data provides no indication that a crystal made from $NiSiF_6 6H_2O$ will transmit ultraviolet light in the wavelengths required for a missile warning system. Consequently, the art has not: considered making a filter having a $NiSiF_6 6H_2O$ crystal which will pass ultraviolet light in the missile warning band, such band being well known to those skilled in the art, and block light at longer wavelengths. However, we have found that $NiSiF_6 6H_2O$ crystals made in accordance with the methods here disclosed have the desired optical properties.

SUMMARY OF THE INVENTION

We provide a crystal comprised of hydrated nickel fluosilicate ($NiSiF_6 6H_2O$). We have found that $NiSiF_6 6H_2O$ crystals are stable in temperatures up to 115° C. for indefinite periods. Sufficiently large crystals can be grown that are very useful for UV filters of the type used in missile approach warning systems. Crystals of $NiSiF_6 6H_2O$ have been successful at withstanding 110° C. to 115° C. for indefinite periods of time under relevant operating conditions and survived at temperatures as high as 130° C. for short periods. The crystal also had the required optical properties including absorption at longer wavelengths and it remained transmissive in the UV band.

The crystals can be grown using a solution formed by reacting $NiCO_3$ in fluorosilicic acid or from a seed crystal in a saturated solution of $NiSiF_6 6H_2O$ Other objects and advantages of the present invention will become apparent from a description of certain preferred embodiments thereof shown in the accompanying drawings:

Description of the Preferred Embodiments

We provide a $NiSiF_6 6H_2O$ crystal useful for ultraviolet sensors and filters. Single crystals of $NiSiF_6 6H_2O$ were grown by solution growth method. We used two approaches for growing single crystals.

A. Crystal Growth from $NiCO_3$ Fluorosilicic Acid

The formation of $NiSiF_6 6H_2O$ is given as:

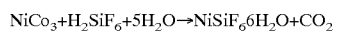

$$NiCo_3 + H_2SiF_6 + 5H_2O \rightarrow NiSiF_6 6H_2O + CO_2$$

We reacted $NiCO_3$ in fluorosilicic acid at 45° C. and kept adding $NiCO_3$ until we observed excess of $NiCO_3$. This process was carried out in a water bath. After an hour, the solution was decanted and placed in a container which was maintained at 40° C. We progressively lowered the temperature from 40° C. to 25° C. in 100 hours. The solution and water bath both were stirred to maintain the homogeneity of temperature. After several hours, we observed the nucleation and settling of small crystals which grew up to one centimeter in size.

B. Crystal Growth from Water Solution

As supplied $NiSiF_6 6H_2O$ was dissolved in water. A saturated solution was prepared at 45° C. by adding $NiSiF_6 6H_2O$ in water. We had used 300 ml water for the solvent. This volume can be changed depending on the size of container. After we prepared the saturated solution, we decanted it into a container which was already maintained at 40° C. We used a small pregrown seed crystal for the nucleating. The bath temperature was lowered in three steps; from 40° C. to 35° C. in 100 hours, from 35° C. to 30° C. in 100 hours and from 30° C. to 25° C. in 100 hours. The crystal grew on the seed, to a size which would allow a crystal of greater than three centimeters to be fabricated. Then, we removed the crystal from the solution.

Those skilled in the art will recognize that the times and temperatures which are used in both methods could be varied. However, we prefer to use temperatures with plus or minus 0.1° C. of those stated. Higher temperatures enable more starting material to be dissolved, but the water evaporates more rapidly. The dominant concern is to create a solution containing enough material to form a crystal of a desired size.

C. Characterization

Figure 1:
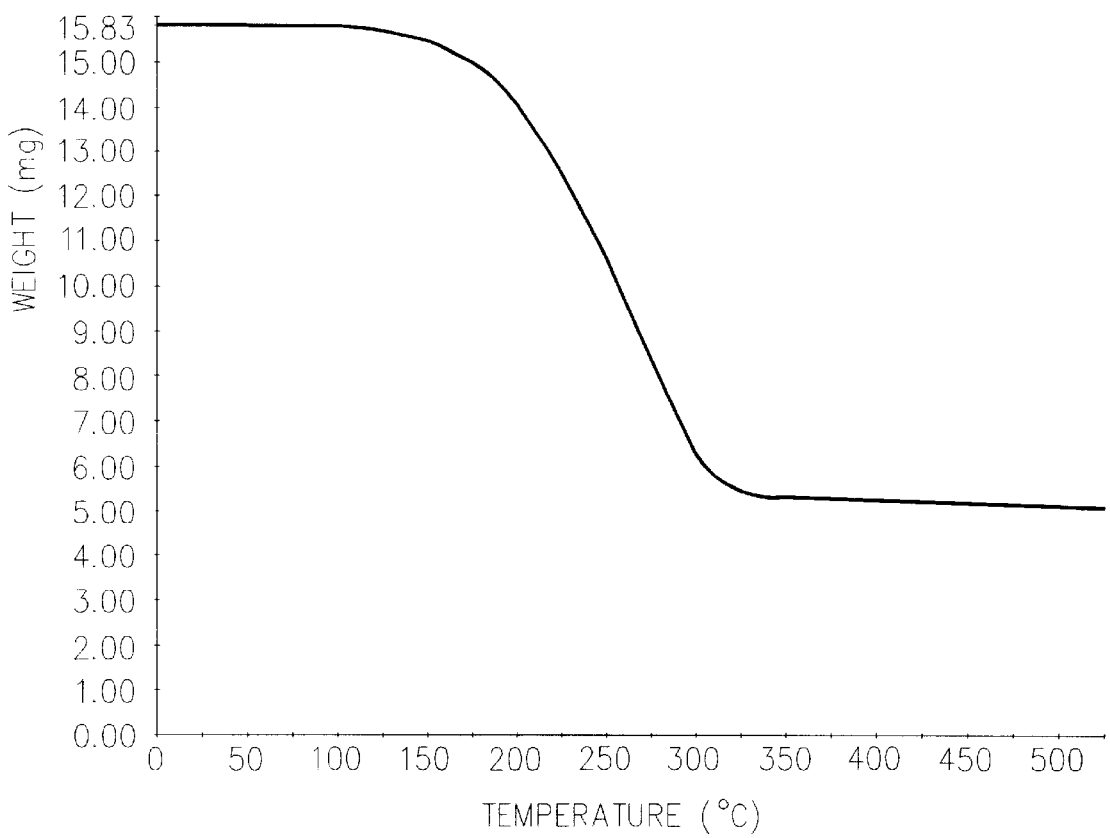
FIG. 1 is a chart showing thermogravimetric analysis for our $NiSiF_6 6H_2O$ crystal.

The crystal composition was confirmed by matching the X-ray lines. We did not observe any additional phases in grown crystal. The lattice parameters of the crystal were:

a=9.317 Angstrom b=9.629 Angstrom and the crystal had hexagonal symmetry. Thermogravimetric analysis was carried out to determine the stability of the crystal. We used a heating rate of 5° per minute in our experiment. The results are shown in FIG. 1. It is clear that the crystal did not start losing water before 120° C. Therefore, the crystal and devices made from the crystal can be expected to perform in temperatures below 120° C. Also, we carried out an independent test by placing the crystal in an oven maintained at 100° C. We did not observe any sign of deterioration up to 48 hours at that temperature. Another crystal was subjected to temperatures in the range of 110° to 115° C. for several hours without degradation.

Figure 2:
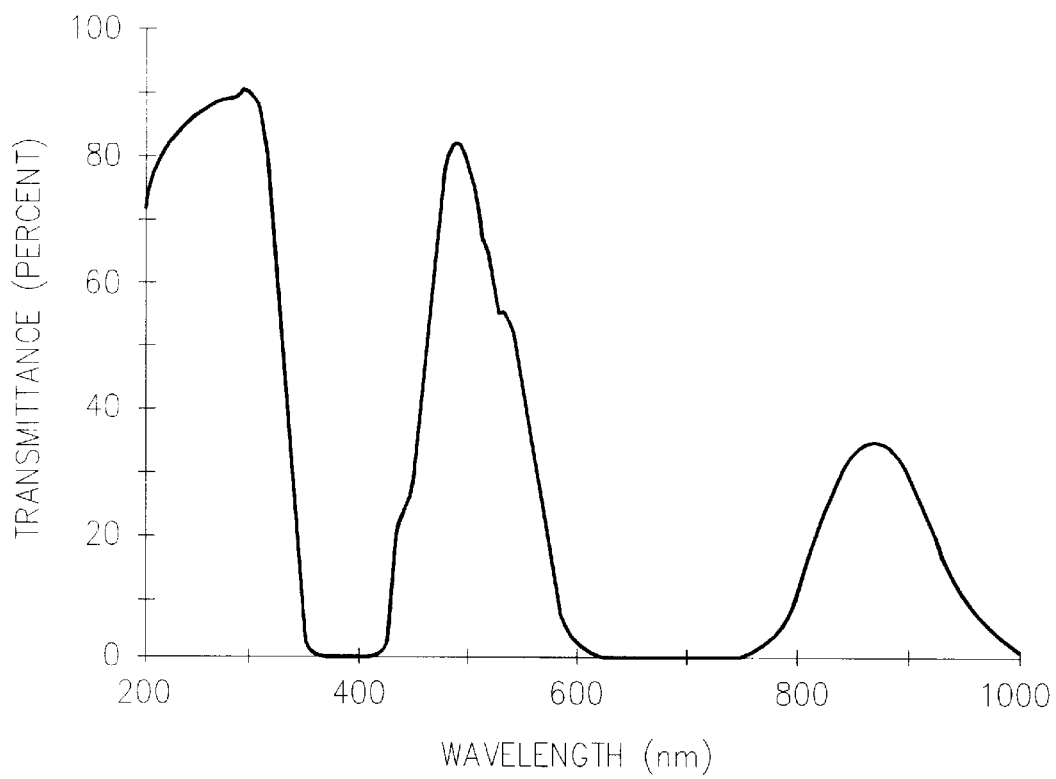
FIG. 2 is an ultraviolet light transmission curve for our $NiSiF_6 6H_2O$ crystal.

The feasibility of desired transmission was evaluated by measuring the transmission of an $NiSiF_6 6H_2O$ crystal using a Varian Cary-5 spectrophotometer. The results are shown in FIG. 2 and indicate that the $NiSiF_6 6H_2O$ crystal is transparent in the ultraviolet range and absorptive at longer wavelengths. Based upon this data it is apparent that this crystal can be used in UV filters and sensors for missile warning systems. We attribute the optical properties to the fact that nickel is present in a cluster with six waters of hydration. It should, therefore, be possible to substitute other flurocompounds such as flurostannate $(Sn\ F_6)^{2-}$ for fluorsilicate and still achieve substantially the same optical properties.

Figure 3:
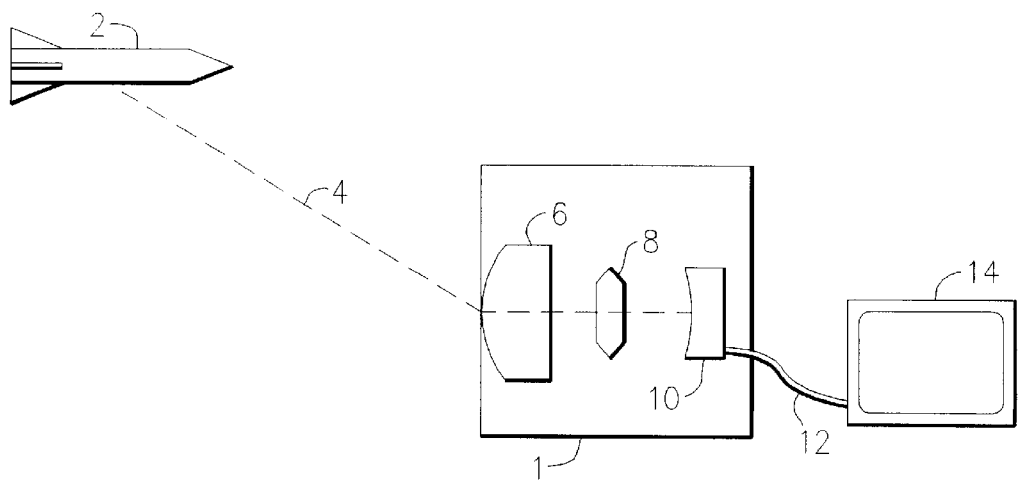
FIG. 3 is a diagram of a sensor device which uses the crystal.

FIG. 3 is a diagram of a sensing device 1 which utilizes the crystal of the present invention. A source of ultraviolet light 2 emits or reflects a beam of ultraviolet, light 4 to the sensing device. The sensing device has an optical system 6 which directs the light to the crystal 8. The optical system 6 may be a single lens as shown in the figure or a series of lenses together with reflectors and filters. Typically, filters comprised of organic dyes in a polyvinyl alcohol plastic are used in this type of system. The beam of ultraviolet light strikes the $NiSiF_6 6H_2O$ crystal 8 which permits passage of ultraviolet light rays having the required wavelengths. The transmitted ultraviolet light strikes a sensor 10 which generates a signal indicating the presence of the ultraviolet light. That signal is transmitted through wire 12 to an alarm or display device 14. The size of the crystal 8 will depend upon the particular sensing device. In a missile approach warning system a crystal of approximately one centimeter in thickness is used.

Although we have described certain present. preferred embodiments of our crystal, methods of making the crystal and devices which utilize that crystal, it should be distinctly understood that our invention is not limited thereto, but may be variously embodied within the scope of the following claims.

We claim:

1. An ultraviolet light filter comprising a single crystal of the formula $NiSiF_6 6H_2O$ which is stable above 85° C. and transmits ultraviolet light in the missile warning band and blocks light at longer wavelengths and wherein the crystal has a diameter of at least 3 cm.

2. An improved ultraviolet light sensing device of the type having a crystal which is stable above 85° C. and permits passage of wavelengths of ultraviolet light through. the crystal and a means for generating a signal responsive to ultraviolet light passing through the crystal wherein the improvement comprises the crystal having a formula $NiSiF_6 6H_2O$.

3. The improved ultraviolet light sensing device of claim 2 wherein the device is a missile approach warning system.

4. An ultraviolet light filter comprising a single crystal of a hexahydrate of nickel and a Group 4B fluorocompound which is stable above 85° C. and transmits ultraviolet light.

5. A method for growing $NiSiF_6 6H_2O$ crystals comprising the steps of a. reacting $NiCO_3$ in fluorosilicic acid to form a solution;

b. maintaining the solution for about an hour at a temperature about five degrees lower than the temperature at which the solution was formed;

c. progressively lowering the temperature of the solution to form at least one $NiSiF_6 6H_2O$ crystal;

d. allowing at least one $NiSiF_6 6H_2O$ crystal to grow to a desired size; and e. removing the at least one $NiSiF_6 6H_2O$ crystal from the solution.

6. The method of claim 5 wherein the solution is formed at 45° C., maintained for one hour at 40° C. and lowered to 25° C.

7. The method of claim 5 wherein a water bath is used to maintain the about 45° C. temperature during the step of reacting $NiCO_3$ in fluorosilicic acid.

8. The method of claim 5 wherein the temperature is lowered over a period of 100 hours.

9. The method of claim 5 also comprising the step of stirring the solution while the temperature of the solution is being lowered.

10. A method for growing $NiSiF_6 6H_2O$ crystals comprising the steps of a. dissolving $NiSiF_6 6H_2O$ in water to form a saturated solution;

b. lowering the temperature of the saturated solution by about 5° C.;

c. maintaining the saturated solution at that lowered temperature;

d. adding at least one seed crystal of $NiSiF_6 6H_2O$ to the saturated solution;

e. lowering the temperature of the saturated solution to grow the seed crystal to a $NiSiF_6 6H_2O$ crystal of a desired size; and f. removing the crystal of a desired size from the saturated solution.

11. The method of claim 10 wherein the saturated solution is formed at 45° C., lowered to 40° C. and then lowered to 25° to grow the seed crystal.

12. The method of claim 11 wherein the temperature is lowered from about 40° C. to about 25° C. by performing the steps of:

a. lowering the temperature from about 40° C. to 35° C. over a first period of time;

b. lowering the temperature from 35° C. to 30° C. over a second period of time; and c. lowering the temperature from 30° C. to about 25° C. over a third period of time.

13. The method of claim 12 wherein the first, second and third periods of time are 100 hours.

14. The method of claim 9 wherein the saturated solution comprises 300 ml water and a sufficient amount of $NiSiF_6 6H_2O$ to form a saturated solution.

* * * * *